(12) United States Patent
Ray

(10) Patent No.: US 11,539,375 B2
(45) Date of Patent: Dec. 27, 2022

(54) SYSTEM AND METHOD FOR DIRECT SIGNAL DOWN-CONVERSION AND DECIMATION

(71) Applicant: The Boeing Company, Chicago, IL (US)

(72) Inventor: Gary A. Ray, Issaquah, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 17/459,655

(22) Filed: Aug. 27, 2021

(65) Prior Publication Data

US 2022/0123763 A1 Apr. 21, 2022

Related U.S. Application Data

(60) Provisional application No. 63/094,765, filed on Oct. 21, 2020.

(51) Int. Cl.
| | | |
|---|---|---|
| *H03M 7/00* | (2006.01) | |
| *H03M 3/00* | (2006.01) | |
| *H03H 17/06* | (2006.01) | |
| *H03M 1/06* | (2006.01) | |
| *H03H 17/02* | (2006.01) | |

(52) U.S. Cl.
CPC ........ *H03M 3/462* (2013.01); *H03H 17/0275* (2013.01); *H03H 17/0621* (2013.01); *H03M 1/0626* (2013.01); *H03M 3/344* (2013.01)

(58) Field of Classification Search
CPC ............... H04L 27/22; H03H 17/0664; H03H 2218/04; H03H 7/0161; H03H 17/0266; H03H 17/0273; H03H 17/0275; H03H 17/0621; H03H 17/0671; H03M 3/462; H03M 1/0626; H03M 1/12; H03M 1/1245; H03M 3/402; H04B 1/0021; H04B 1/1036
USPC .................................................... 341/61, 143
See application file for complete search history.

(56) References Cited

U.S. PATENT DOCUMENTS

| | | | | |
|---|---|---|---|---|
| 5,375,146 A | * | 12/1994 | Chalmers ................. | H04B 1/30 375/350 |
| 6,023,717 A | | 2/2000 | Argyroudis | |
| 6,337,636 B1 | * | 1/2002 | Page ......................... | G01V 1/22 340/870.14 |
| 6,927,717 B1 | * | 8/2005 | Oprescu .................. | H03M 3/34 341/143 |
| 8,625,726 B2 | * | 1/2014 | Kuan .................... | H04B 1/0021 375/247 |
| 8,654,898 B2 | * | 2/2014 | Bereza ................ | H04L 25/0272 375/323 |
| 9,191,043 B1 | * | 11/2015 | Zhang ................ | H03H 17/0273 |

(Continued)

*Primary Examiner* — Linh V Nguyen
(74) *Attorney, Agent, or Firm* — Ostrager Chong Flaherty & Broitman P.C.

(57) ABSTRACT

Systems and methods for direct signal down-conversion and decimation in a digital receiver. The digital receiver produces a decimated passband version of the signal without the problems associated with use of digital mixers. The digital receiver includes a passband-to-passband decimator/down-converter that implements an algorithm which takes the signal band (frequency and bandwidth or lower and upper frequencies) where a signal is present and produces a decimation rate and phase for use by a low-pass mixer-free down-conversion. The digital receiver technology may be efficiently implemented on a digital signal processor or field-programmable gate array.

20 Claims, 6 Drawing Sheets

(56) References Cited

U.S. PATENT DOCUMENTS

| | | | |
|---|---|---|---|
| 9,306,606 B2 * | 4/2016 | Zhang | H04B 1/1036 |
| 9,954,561 B2 | 4/2018 | Ray et al. | |
| 2004/0190660 A1 * | 9/2004 | Morris | H03M 3/47 |
| | | | 375/350 |
| 2006/0284749 A1 * | 12/2006 | May | H03M 3/498 |
| | | | 341/61 |
| 2011/0267130 A1 * | 11/2011 | Hinson | H03H 17/0283 |
| | | | 327/334 |
| 2017/0324427 A1 * | 11/2017 | Myung | H03M 13/255 |

* cited by examiner

SYSTEM AND METHOD FOR DIRECT SIGNAL DOWN-CONVERSION AND DECIMATION

RELATED PATENT APPLICATION

This application claims the benefit, under Title 35, United States Code, Section 119(e), of U.S. Provisional Application No. 63/094,765 filed on Oct. 21, 2020.

BACKGROUND

The technology disclosed herein generally relates to radiofrequency (RF) receivers and, in particular, relates to digital RF receivers that reduce the sample rate of samples output from an analog-to-digital converter (ADC) using decimation.

As used herein, the term "sampling rate" means the speed at which the ADC is sampling an analog input, while the term "sample rate" (a.k.a. "data rate") means the rate at which samples are being output by a circuit. As used herein, the term "to decimate" means to reduce the sample rate by a factor of L, where L is a positive integer equal to or greater than 2 As used herein, the term "to down-convert" means to convert a digitized band-limited signal to a lower frequency signal at a lower sample rate.

Wideband ADCs are being used in either wideband or direct RF down-conversion receivers. Since the receive process becomes purely digital, signal fidelity can be maintained much easier than with analog methods. Previous solutions used baseband operation, digital mixers, and low-pass filter down-conversion. The standard process of down-conversion and decimation in a digital receiver typically requires generating a center frequency tone which is mixed (multiplied) with the incoming signal and then low-pass filters are used to reduce this to a baseband signal. Existing down-conversion and decimation techniques require very high-quality and expensive digital mixers or have inherently reduced performance as a result of mixing the incoming signal with an inaccurate digital tone, which tends to enhance phase errors due to the process of multiplication with a "noisy" signal.

Some digital receivers enhance the final signal characterization and processing using passband methods rather than baseband methods. This allows for the inherent uncertainty in the center frequency of the signal to be tolerated since the receiver clock and transmitter clock are different. But it is still desired to have processing be done at reduced sample rates so that receiver computational hardware such as digital signal processors (DSPs) or field-programmable gate arrays (FPGAs) can be used more efficiently.

SUMMARY

The subject matter disclosed in detail below is directed to systems and methods for direct signal down-conversion and decimation in a digital receiver. The digital receiver produces a decimated passband version of the signal without the problems associated with use of digital mixers. The digital receiver includes a passband-to-passband decimator/down-converter that implements an algorithm which takes the signal band (frequency and bandwidth or lower and upper frequencies) where a signal is present and produces a decimation rate and phase for use by a low-pass mixer-free down-conversion.

The technology proposed herein allows for mixer-free receiver architectures even in the digital domain. This in turn produces lower digital phase noise and better signal demodulation and characterization. In particular, the approach adopted herein can improve both wideband radar and communications receiver architectures at a fundamental level. Thus, for the same hardware cost, one can achieve lower bit error rates and longer-range radar detection processes. The mixer-free decimation method proposed herein also facilitates reducing the overall size, weight and power (SWAP) of traditional receivers.

Although various embodiments of systems and methods for direct signal down-conversion and decimation in a digital receiver will be described in some detail below, one or more of those embodiments may be characterized by one or more of the following aspects.

One aspect of the subject matter disclosed in some detail below is a method for decimating and down-converting passband signals comprising: (a) transducing electromagnetic radiation carrying a repetitive signal into an analog electrical passband signal; (b) converting the analog electrical passband signal into passband signal samples at a sampling rate; (c) estimating a center frequency and a bandwidth of the passband signal; (d) calculating a decimation ratio and a channel index based on the estimated center frequency and the estimated bandwidth; and (e) decimating and down-converting the passband signal samples to a sample rate which is less than the sampling rate based on the decimation ratio and channel index.

Another aspect of the subject matter disclosed in some detail below is a passband-to-passband decimation/down-conversion circuitry comprising: circuitry for performing an algorithm that converts an estimated signal center frequency $f_C$ and an estimated signal bandwidth b to a decimation ratio L and a channel index k; and a polyphase decimator/down-converter which is connected to receive the decimation ratio L and channel index k and configured to decimate the passband samples having a sample rate $f_S$ by a factor of L and then down-convert an original passband frequency to a lower passband frequency.

In accordance with one embodiment of the circuitry described in the immediately preceding paragraph, the polyphase decimator/down-converter comprises: a plurality of decimators connected to receive passband signal samples: and a plurality of down-converters connected to receive decimated passband signal samples from the plurality of decimators respectively. Each down-converter comprises a respective bandpass filter followed by a respective multiplier.

In accordance with one proposed implementation, the algorithm comprises: defining boundaries of a frequency interval $[f_{lo}, f_{hi}]$ based on the estimated center frequency and estimated bandwidth; setting a value of a parameter m equal to floor(1/b), where b is the estimated bandwidth; computing $m_{hi} = \lfloor mf_{hi} \rfloor$ using a floor function; computing $v_{hi} = \lfloor m_{hi}/f_{hi} \rfloor$ using the floor function; computing $m_{lo} = \lfloor mf_{lo} \rfloor$ using the floor function; computing $v_{lo} = \lceil m_{lo}/f_{lo} \rceil$ using a ceiling function; computing the decimation ratio $L = \max(v_{lo}, v_{hi})$; and computing the channel index $\underline{k} = \lfloor Lf_{lo} \rfloor$.

A further aspect of the subject matter disclosed in some detail below is a signal processing system comprising: a sensor configured to transduce electromagnetic radiation carrying a repetitive signal into an analog electrical signal; an analog-to-digital converter configured to convert the analog electrical signal into signal samples; a cueing system connected to receive the signal samples and configured to process the signal samples to generate digital data representing an estimated signal center frequency $f_C$ and an estimated bandwidth b; and a plurality of signal separation and tracking channel comprising: circuitry for performing an algorithm that converts the estimated signal center frequency $f_C$ and the estimated signal bandwidth b to a decimation ratio L and a channel index k; and a polyphase decimator/down-converter which is connected to receive the decimation ratio L and channel index k and configured to decimate the passband samples having a sample rate $f_S$ by a factor of L and then down-convert an original passband frequency to a lower passband frequency.

Other aspects of systems and methods for direct signal down-conversion and decimation in a digital receiver are disclosed below.

BRIEF DESCRIPTION OF THE DRAWINGS

The features, functions and advantages discussed in the preceding section may be achieved independently in various embodiments or may be combined in yet other embodiments. Various embodiments will be hereinafter described with reference to drawings for the purpose of illustrating the above-described and other aspects.

Reference will hereinafter be made to the drawings in which similar elements in different drawings bear the same reference numerals.

DETAILED DESCRIPTION

Illustrative embodiments of systems and methods for direct signal down-conversion and decimation in a digital receiver are described in some detail below. However, not all features of an actual implementation are described in this specification. A person skilled in the art will appreciate that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Before describing a method for direct signal down-conversion and decimation in a digital receiver, a brief description of how standard polyphase techniques are used for down-conversion will be provided. Polyphase filtering represents an approach to implement decimation (or interpolation) in a flexible and computationally efficient way. In a standard approach, decimation filters operate at the higher original sample rate of the incoming signal A. However, ADCs can operate many times faster than processors can process samples. Hence this standard approach is not feasible. Suppose that the system designer wants the system to operate L times slower than the original sampling rate. The idea in a polyphase structure is to split the filtering into L parallel stages operating at the lower sample rate $f_S/L$, where L denotes the decimation ratio.

Polyphase structures start with a given filter H(z) of order DL and split it into L sub-filters $H_i(z^L)$, where i=0, ..., L−1, each of order D, by using subsets of the coefficients that are L apart in sequence. This means that the coefficients of the filter $H_i(z^L)$ are $$[h_{0+i}, h_{L+i}, h_{2L+i}, \ldots, h_{(D-1)L+i}]$$

where the coefficients of H(z) are $$[h_0, h_1, h_2, \ldots, h_{DL-1}]$$

Figure 1:
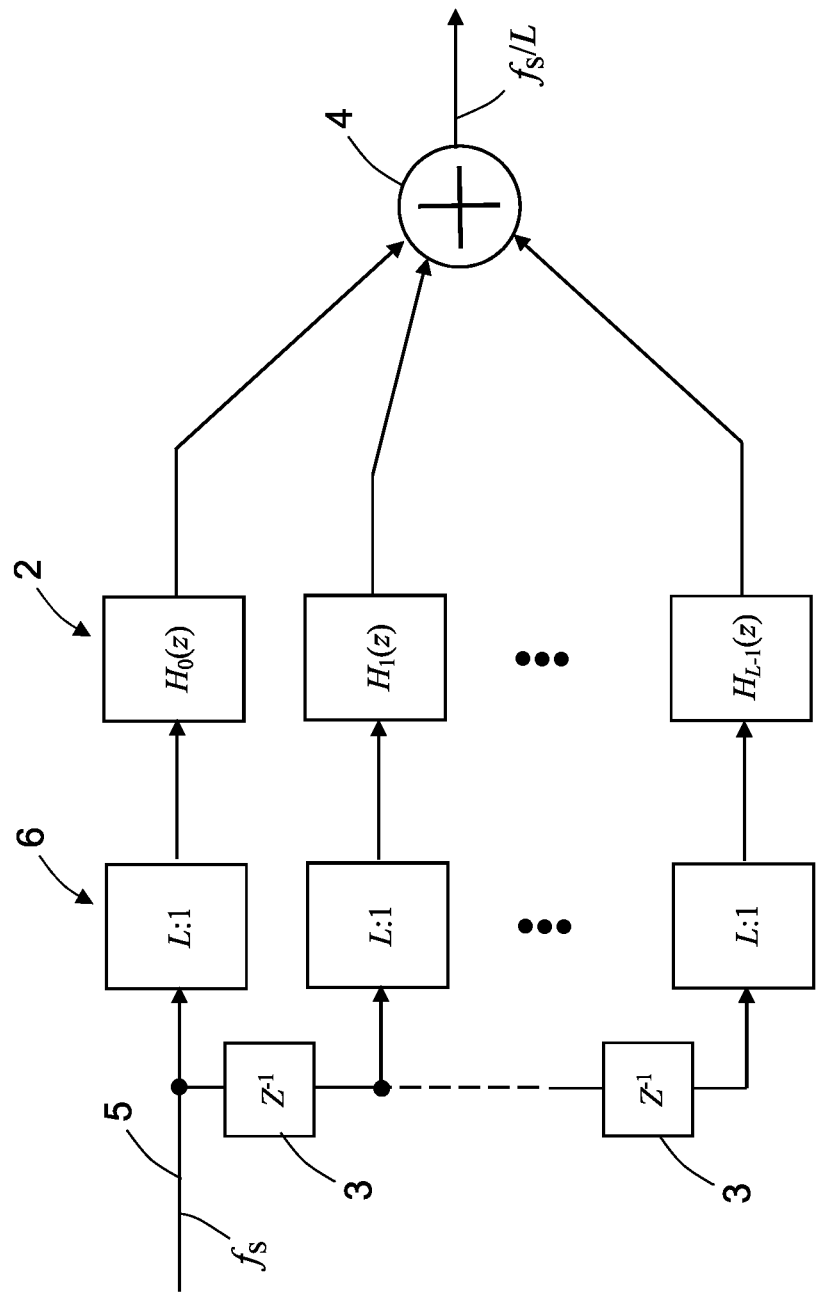
FIG. 1 is a diagram representing circuitry that includes polyphase filters for decimation.

In decimation applications, the decimator (also known as a "down-sampler"), which traditionally operates on the filter output, can be transferred to the front of the L sub-filters by delaying the i-th branch by i samples ($z^i$), decimating by L, and filtering using ordinary unit delays at the reduced clock rate ($H_i(z)$). FIG. 1 is a diagram representing circuitry that includes polyphase sub-filters 2 for decimation. The conductor 5, which carries samples from an ADC (not shown in FIG. 1) having a sampling rate $f_S$, is connected to the polyphase sub-filters 2 in sequence by a decimator 6 which includes delay circuits 3 connected in series. The resulting sample streams are decimated by a factor of L and then input into respective polyphase sub-filters 2. The resulting samples output by polyphase sub-filters 2 are summed by a summer 4 that outputs samples at a sample rate $f_S/L$.

The previous discussion applies to both low-pass and bandpass decimators, but typically, mixers are used to convert bandpass to low-pass structures by using frequency translation. However, for certain center frequencies, the mixing step can be done with almost no extra calculations in this structure. In other words, a slightly modified structure can be used to both filter and down-convert.

Suppose the received signal has a center frequency $f_C$ which is an integer multiple of the sample rate $f_S/L$. In terms of the normalized frequency variable $\omega_C = 2\pi f_C/f_S$, this means that $\omega_C$ is an integer multiple (denoted as the channel index k in what follows) of $2\pi/L$. Then one can translate the corresponding low-pass filter H(z) to a combined low-pass/down-converting filter (denoted by G(z) herein) as follows. Let h(n) be the n-th sample output of H applied to its input and $h_i(n)$ be the n-th sample output of $H_i$ applied to its input. Similarly, let g(n) be the n-th sample output of G applied to its input and $g_i(n)$ be the n-th sample output of G, (the combined filter using $H_i$ together with down-conversion) applied to its input. The system designer may want to produce g(n)=h(n)exp{−j$\omega_C$n} (where the symbol * indicates convolution) in order to mix the output down in frequency. This can be done using the polyphase structure shown in FIG. 1 to produce the sequence [$h_0(n)$, $h_1(n+1)$, ..., $H_{L-1}(n+L-1)$, $h_0(n+L)$, ...] which, using the polyphase approach, is the same sequence as h(n) Similarly, $$g_0(n) = h_0(n) \exp\{-jk(2\pi)(0)/L\}$$

$$g_1(n+1) = h_1(n+1) \exp\{-jk(2\pi)(1)/L\}$$

$$g_2(n+2) = h_2(n+2) \exp\{-jk(2\pi)(2)/L\}$$

$$\vdots$$

-continued $$g_{L-1}(n+L-1) = h_{L-1}(n+L-1)\exp\{-jk(2\pi)(L-1)/L\}$$

$$g_0(n+L) = h_0(n+L)\exp\{-jk(2\pi)(0)/L\}$$

$$\vdots$$

produces the sequence $[g_0(n), g_1(n+1), \ldots, g_{L-1}(n+L-1), g_0(n+L), \ldots]$, which is the same sequence as g(n). Here the normalized frequency $\omega_C$ is a fixed integer multiple of $2\pi/L$, which integer k is the channel index, i.e., $\omega_C = k(2\pi/L)$. This implies that the same polyphase representation can be used to compute g(n) as in the low-pass case except for the L−1 multipliers 8 shown in FIG. 2 which receive respective weights $w_{l,k}$ and respective outputs from sub-filters $H_1(z)$ to $H_{L-1}(z)$.

Figure 2:
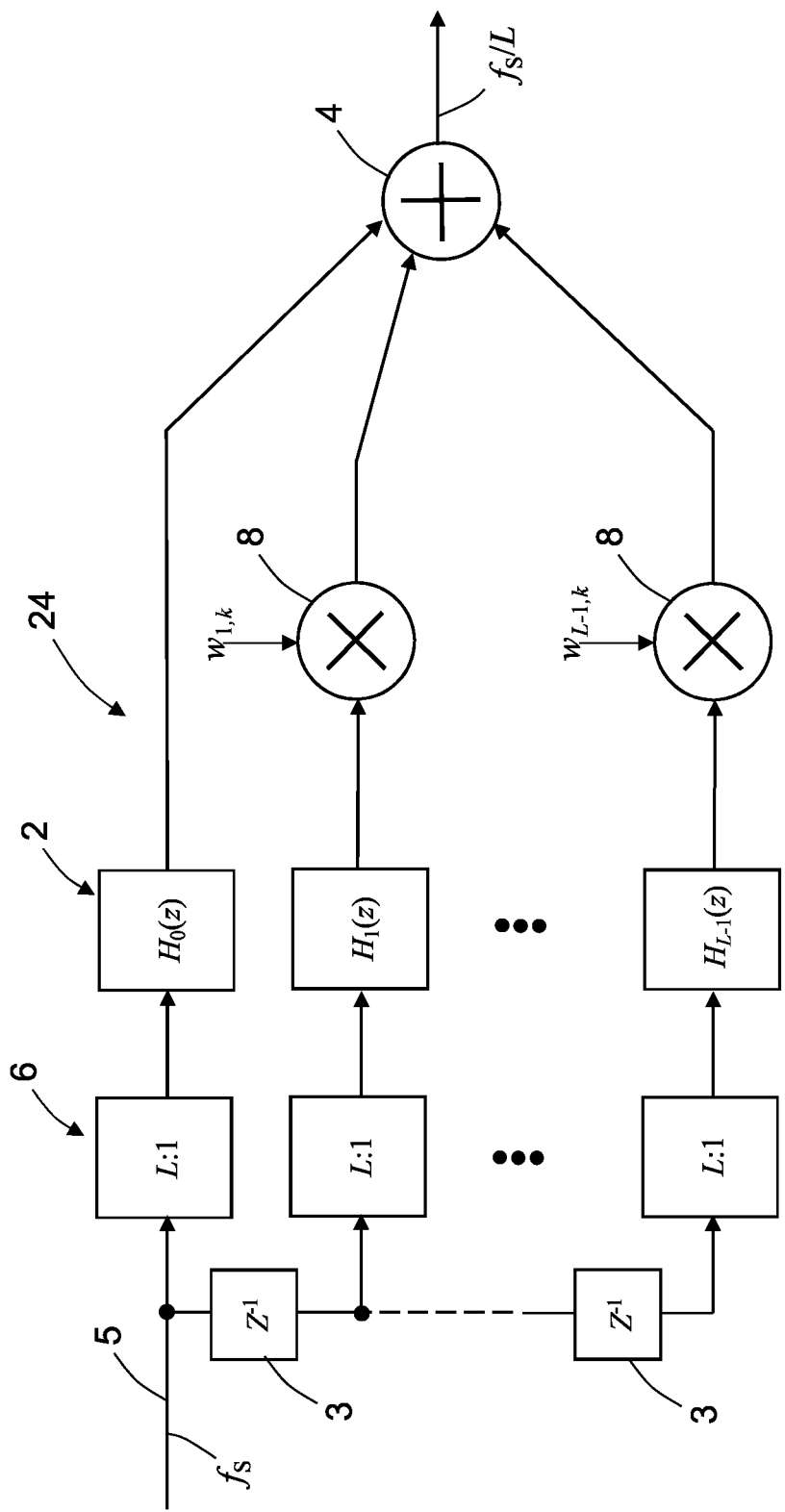
FIG. 2 is a diagram representing circuitry configured to perform generic polyphase decimation/down-conversion in accordance with the concept disclosed herein.

FIG. 2 is a diagram representing circuitry configured to perform generic polyphase decimation/down-conversion in accordance with the concept disclosed herein. The polyphase decimator/down-converter 24 is configured to down-convert an original passband frequency to a lower passband frequency and decimate the passband samples having a sample rate $f_S$ by a factor of L. The polyphase decimator/down-converter 24 comprises: a plurality of decimators 6 connected to receive passband signal samples; and a plurality of down-converters connected to receive decimated passband signal samples from the plurality of decimators 6 respectively. Each down-converter comprises a respective sub-filter 2 followed by a respective multiplier 8. The outputs of multipliers 8 are denoted herein as $w_{l,k} = \exp\{-jk(2\pi)l/L\}$, where $l=1, \ldots, L-1$. ($w_{l,k}$ refers to the l-th weight at the k-th sample time.) The output from sub-filter $H_0(z)$ and the outputs from multipliers 8 are summed by a summer 4.

The architecture shown in FIG. 2 provides both filtering and down-conversion for a fixed center frequency $f_C$. However, this would not enable changing the center frequency and decimation ratio in real time in order to match or track dynamic signals. The solution proposed herein is to use this approach to take a dynamically changing signal (with changing center frequency and bandwidth) and produce a filtered and down-converted sampled signal in real time.

Figure 3A:
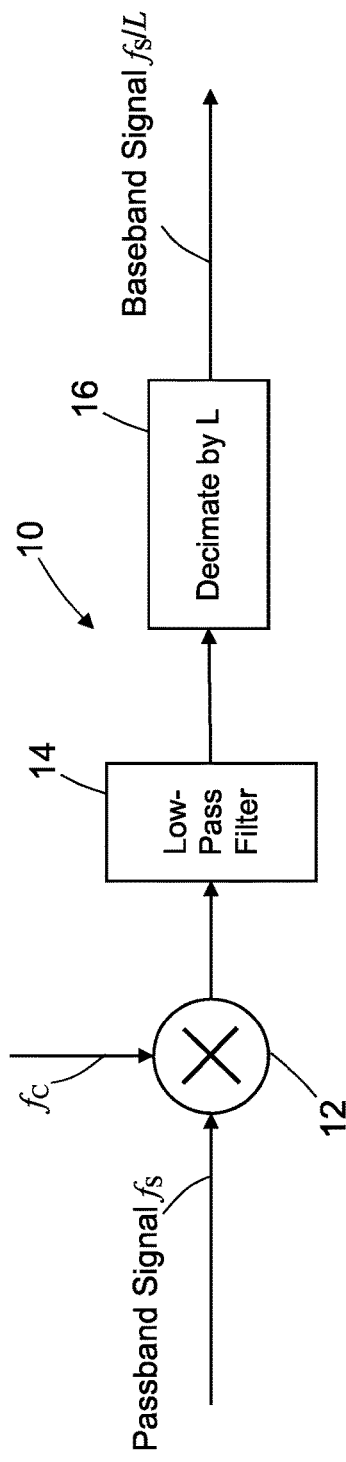
FIG. 3A is a diagram representing circuitry configured to perform passband-to-baseband processing.

FIG. 3A is a diagram representing circuitry 10 configured to perform passband-to-baseband processing. The circuitry 10 includes a mixer 12 that mixes a passband signal having a sample rate $f_S$ and a signal having a center frequency $f_C$. The mixed signal output by mixer 12 then passes through a low-pass filter 14 that down-converts the passband frequency to a baseband frequency and a decimator 16 which decimates the baseband samples by a factor of L. The result is a baseband signal having a sample rate $f_S/L$.

Figure 3B:
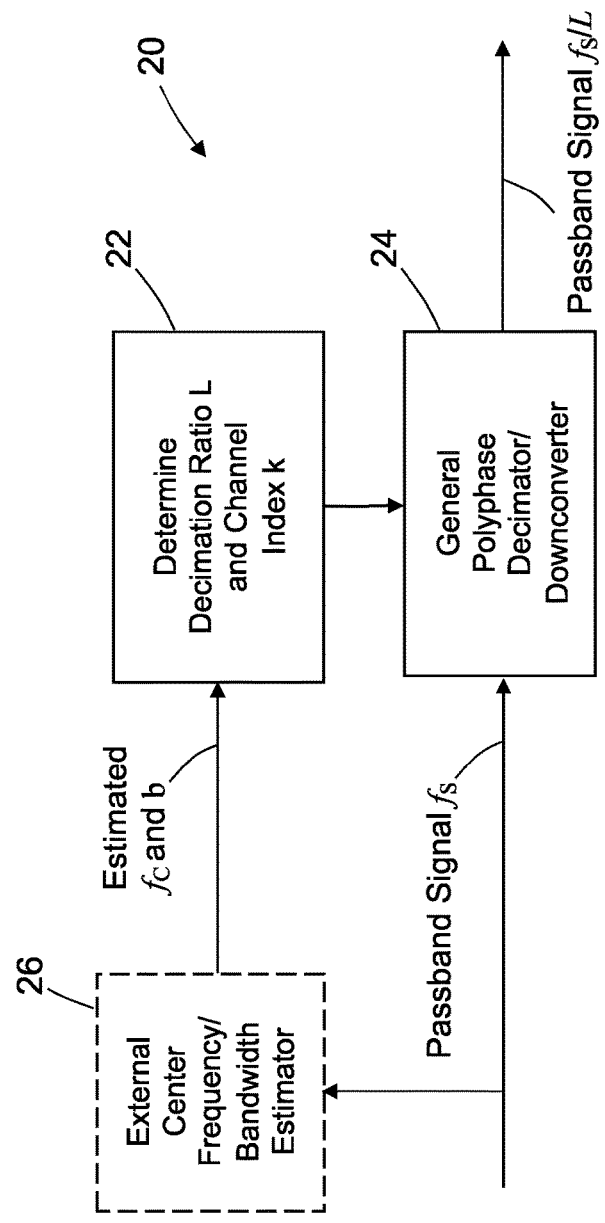
FIG. 3B is a diagram representing circuitry configured to perform passband-to-passband processing in accordance with one embodiment.

Instead of the normal processing steps for standard passband-to-baseband down-conversion and decimation depicted in FIG. 3A, an innovative passband processing method is shown (at a high level) in FIG. 3B, which diagram represents passband-to-passband decimation/down-conversion circuitry 20 configured to perform passband-to-passband processing. Signal down-conversion and decimation to a passband representation at a lower sample rate requires (as described above) both a decimation ratio L and a channel index k. The passband-to-passband decimation/down-conversion circuitry 20 includes circuitry for performing an algorithm 22 that converts an estimated signal center frequency $f_C$ and an estimated signal bandwidth b to a decimation ratio L and a channel index k. The algorithm 22 identified in FIG. 3B includes the steps of determining the best decimation ratio L and channel index k that can produce the most efficient mixer-free reduction of a passband signal to a lower sampling rate without signal distortion. The estimated signal center frequency $f_C$ and estimated signal bandwidth b are received from an external center frequency/bandwidth estimator 26. The passband-to-passband decimation/down-conversion circuitry 20 further includes a general polyphase decimator/down-converter 24 which receives the decimation ratio L and channel index k. The general polyphase decimator/down-converter 24 decimates the passband samples by a factor of L and then down-converts the original passband frequency to a lower passband frequency. The result is a passband signal having a sample rate $f_S/L$.

More specifically, the polyphase decimator/down-converter 24 receives the decimation ratio L and channel index k from algorithm 22 and then generates the weights $w_{l,k}$. The polyphase decimator/down-converter 24 may be configured to either look up the values in a table or compute the values using the equation $w_{l,k} = \exp\{-jk(2\pi)l/L\}$.

Figure 4:
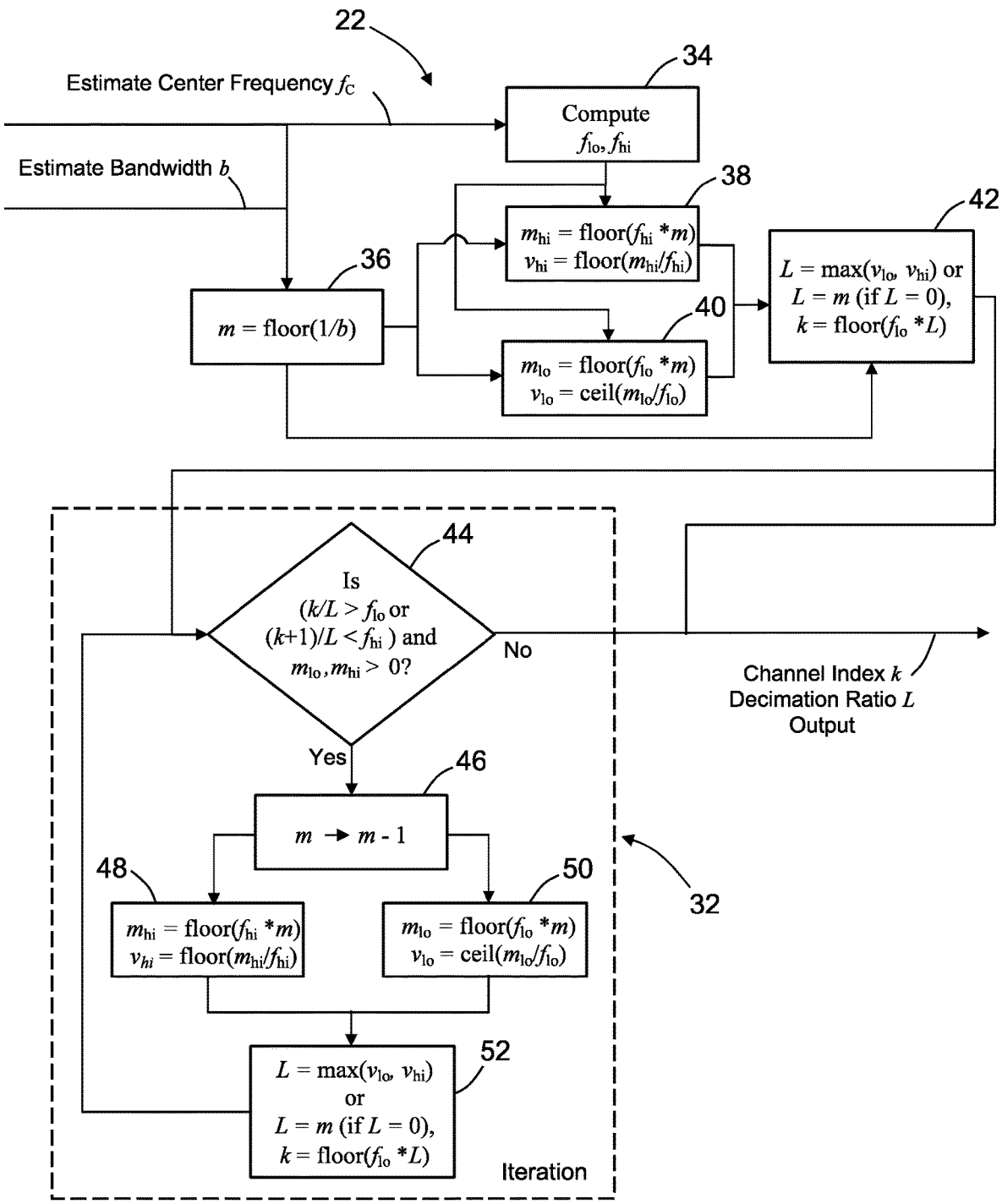
FIG. 4 is a diagram showing steps performed by a decimation ratio and channel index algorithm in accordance with one embodiment.

The specific steps of the algorithm 22 identified in FIG. 3B in accordance with one proposed implementation are shown in FIG. 4. The steps of the algorithm 22 are expressed mathematically in FIG. 4. The algorithm consists of the steps to determine in real time the best decimation ratio L with its corresponding channel index k. What this means is that the decimation ratio is as low as possible so that the incoming signal is translated down to its passband version without any frequency folding. The algorithm 22 uses as input the estimated center frequency $f_C$ and estimated bandwidth b of the incoming signal (as shown in FIG. 3B) or, what is equivalent, a signal band defined by a frequency interval $[f_{lo}, f_{hi}]$. This is an external input that can come from any source that would produce such an estimate. For example, U.S. patent application Ser. No. 16/871,521 discloses a method that uses an array of IIR filters that feed an inverted state tree. The inverted state tree provides the directions for separating, detecting, and tracking multiple simultaneous signals that are being received. These signals could be either radar or communications signals and are of widely differing frequencies, band-widths, and other characteristics. The algorithm 22 produces a decimation ratio L and channel index k as output.

FIG. 4 shows the most general version of the algorithm 22, which involves an indeterminate number of iterations 32 (including the option of no iteration) as shown in the dashed rectangle in FIG. 4. The first steps involve defining the boundaries of the frequency interval $[f_{lo}, f_{hi}]$ as follows: $f_{lo} = f_C - b/2$ and $f_{hi} = f_C + b/2$ (step 34). Also, the value of m is set equal to floor(1/b) (step 36). (The floor function is defined as the greatest integer smaller than the argument.) One may compute $m_{hi}$ and $v_{hi}$ mathematically (step 38) as $m_{hi} = \lfloor mf_{hi} \rfloor$ and $v_{hi} = \lfloor m_{hi}/f_{hi} \rfloor$ using the floor function. Here $m = \lfloor 1/b \rfloor$. The values $m_{lo}$ and $v_{lo}$ may be computed (step 40) in a similar manner using the floor and ceiling functions. From these values, one can estimate L and k (step 42) as follows:

$$L = \max(v_{lo}, v_{hi})$$

unless $\max(v_{lo}, v_{hi}) = 0$. In the latter case, set L=m. Also set $$\underline{k} = \lfloor Lf_{lo} \rfloor.$$

The values (L,k) can be output at this point, or the values can be refined by doing one or more iterations 32 as follows:

First, a determination is made whether $k/L > f_{lo}$ or $(k+1)/L < f_{hi}$ and $m_{lo}$ and $m_{hi} > 0$ or not (step 44). If these conditions are met, then the refinement is performed (proceed to step 46); otherwise the current results are output. In step 46, the value of m is decremented by 1 (m→m−1). Then the values $m_{hi}$ and $v_{hi}$ are recomputed using the new value of m and functions $m_{hi} = \lfloor mf_{hi} \rfloor$ and $v_{hi} = \lfloor m_{hi}/f_{hi} \rfloor$ (step 48). Similarly, the values $m_{lo}$ and $v_{lo}$ are recomputed using the new value of m and functions $m_{lo} = \lfloor mf_{lo} \rfloor$ and $v_{lo} = \lceil m_{lo}/f_{lo} \rceil$ (step 50). Then L and k are recomputed as before using the new values of $m_{hi}$, $v_{hi}$, $m_{lo}$, and $v_{lo}$ (step 52). The iteration 32 then returns to step 44.

Figure 5:
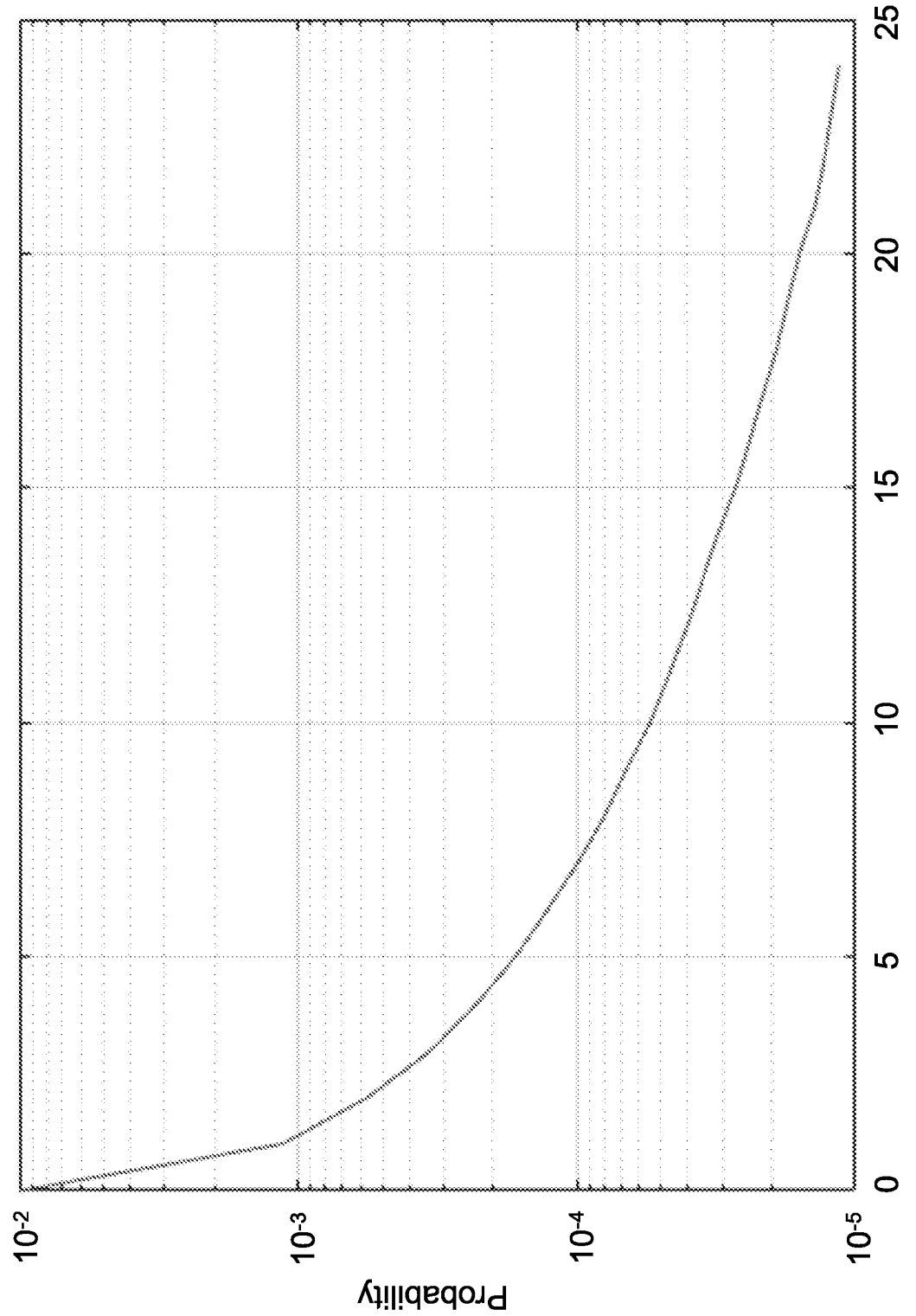
FIG. 5 is a graph showing the probability of a given number of iterations in a simulation of the decimation ratio and channel index algorithm depicted in FIG. 4.

However, an indeterminate number of iterations are typically not used in a real-time processing system since that would change the delay. Fortunately, simulations show that using a fixed number of iterations works very well. The algorithm was implemented and the number of iterations required for signal bands of all types are characterized through simulation as shown in FIG. 5.

The simulation is plotted in terms of the cumulative sum of probabilities for all iteration numbers above a given number. Thus, only one of 100 signals requires iteration. And only one out of 1000 signals requires more than one iteration. These results can be read directly from FIG. 5. This means that the number of iterations can be constrained to a specific number and still achieve good results in practice.

The innovative technology proposed herein provides an efficient means of down-conversion and decimation of a blind source separated signal. The proposed technology adopts a mixer-free approach to signal detection, characterization, and demodulation. The algorithm 22 can efficiently produce a decimation rate that is most efficient for a mixer-free down-conversion and decimation. In addition, the proposed technology may be implemented efficiently on a digital signal processor or field-programmable gate array. These features provide benefits, including reduced phase noise, increased signal-to-noise ratio and detection rates, and better demodulation performance, especially for larger constellations as used in modern 5G signals.

The decimation/down-conversion circuitry proposed herein is applicable to a signal separation and tracking stage within an electronic warfare (EW) receiver which must produce pulse descriptor words (PDWs) for a large number of incoming radar signals. Or the decimation/down-conversion circuitry could be used by a commercial 5G system that monitors a very wide bandwidth and characterizes all the incoming interfering signals as well as its own signals in order to reduce interference or increase bandwidth usage. In addition, the decimation/down-conversion circuitry could also serve as the front end portion of a commercial receiver that monitors aircraft collision avoidance radars near airports. One example application will now be described with reference to FIG. 6.

Figure 6:
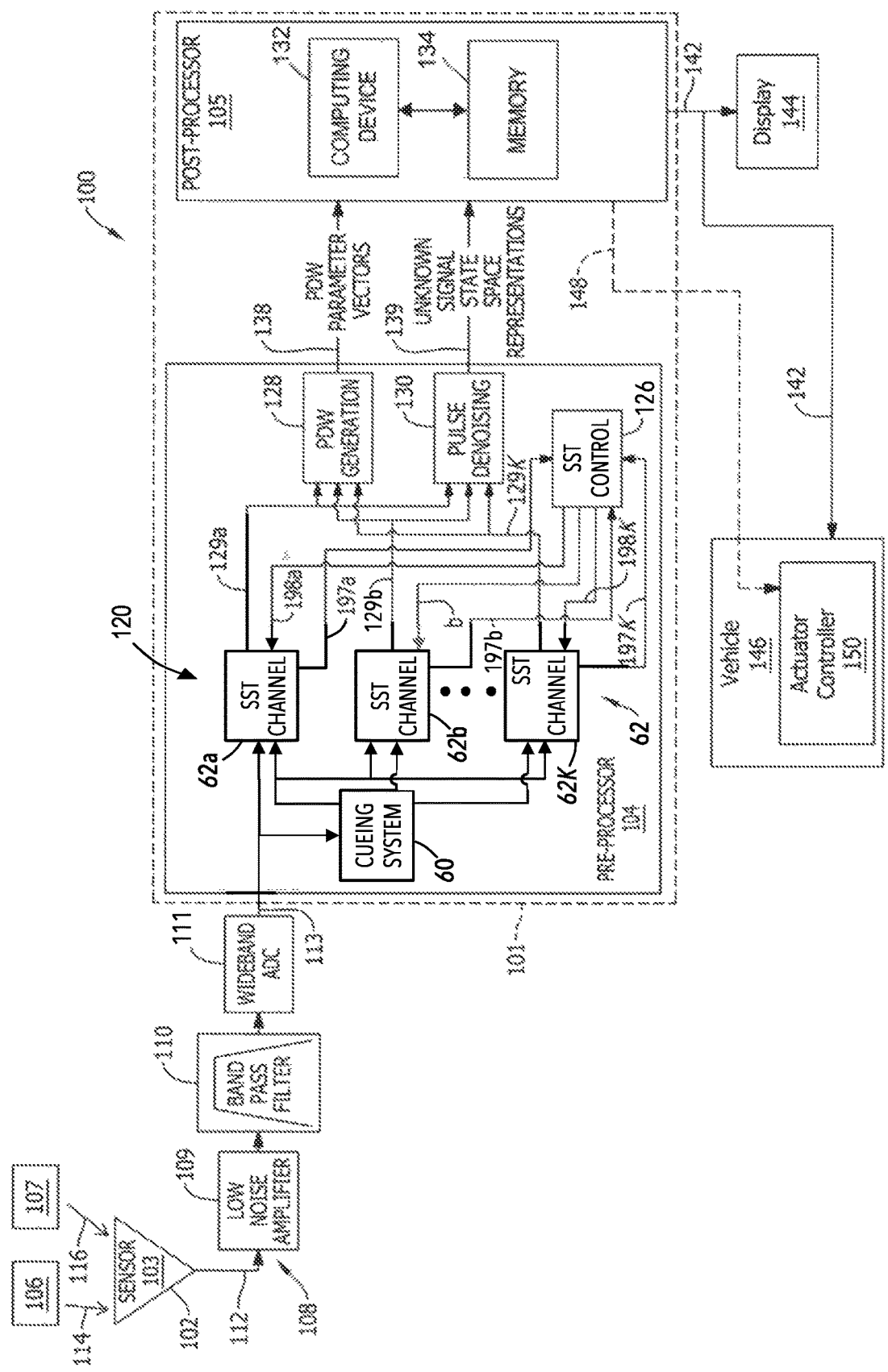
FIG. 6 is a block diagram showing a cueing architecture incorporated in a signal processing system for generating pulse descriptor words (PDWs) using signal separation and tracking (SST).

FIG. 6 is a block diagram identifying components of a signal processing system 100 for generating PDWs using signal cueing, separation, and tracking. The signal processing system 100 includes a signal data processor 101 communicatively coupled to an antenna 102 by way of a pre-conditioner 108. Antenna 102 may be embodied as a wide-area sensor 103. Signal data processor 101 includes a pre-processor 104 and a post-processor 105. Sensor 103 is configured to surveil at least one radar signal emitter (two radar signal emitters 106 and 107 are indicated). Pre-conditioner 108 includes at least one electronic component (e.g., a low-noise amplifier 109, a bandpass filter 110, and a wideband ADC 111) configured to pre-condition a sensor output signal 112. In operation, pre-conditioner 108 is configured to convert a sensor output signal 112 received from sensor 103 into a conditioned signal 113 transmitted to pre-processor 104. Each conditioned signal 113 is derived from a time-varying signal received at sensor 103. Time-varying signals may include a mix of signals received from radar signal emitters 106 and 107. For example, time-varying signals may include a first radar signal 114 generated by radar signal emitter 106 or a second radar signal 116 generated by radar signal emitter 107, which signals are received by sensor 103.

The pre-processor 104 includes a cueing system 60 and a signal separation and tracking subsystem 120 (hereinafter "SST subsystem 120). The SST subsystem 120 includes a plurality of signal separation/tracking (SST) channels 62. The total number of SST channels 62 is expressed as an integer K. In operation, conditioned signal 113 is transmitted from pre-conditioner 108 to cueing system 60, where the center frequency and bandwidth of incoming signal 113 are estimated. More specifically, the cueing system 60 includes a respective center frequency/bandwidth estimator for each frequency band of interest. Each cueing center frequency/bandwidth estimator includes a pair of overlapping fixed filters and signal processing circuitry that outputs center frequency and bandwidth estimates to a respective tunable filter in each SST channel $62a, 62b, \ldots, 62K$. The cueing system 60 detects the presence of signals at certain frequencies and bandwidths, without doing noise reduction as the channelizer would have done in a traditional approach. Instead, noise reduction is done in the SST channels $62a, 62b, \ldots, 62K$.

Each SST channel 62 includes respective passband-to-passband decimation/down-conversion circuitry 20 that receives the estimated center frequency $f_C$ and estimated bandwidth b from the cueing system 60. For each signal of interest, the passband-to-passband decimation/down-conversion circuitry 20 converts the estimated center frequency $f_C$ and estimated bandwidth b to a decimation ratio L and a channel index k.

The SST subsystem 120 further includes an SST control module 126 coupled to each SST channel 62. SST control module 126 is configured to transmit a respective SST control signal $198a$ through $198K$ to each of SST channels 62.

Pre-processor 104 further includes a PDW generation module 128 and a pulse denoising module 130, both of which are coupled to receive decimated/down-converted signals 129 from the plurality of SST channels 62. PDW generation module 128 generates PDW parameter vector signals 138 based on respective decimated/down-converted signals 129 (e.g., $129a, 129b, \ldots, 129K$) received from the SST channels 62 (e.g., $62a, 62b, \ldots, 62K$). Each PDW parameter vector signal 138 contains data representative of characteristics of interest of one of radar signals 114 and 116 derived from a singular pulse of separated signal 129 (e.g., frequency, bandwidth, time of arrival, time of departure, pulse width, pulse amplitude, pulse repetition interval, and/or angle of arrival (AOA)). Pulse denoising module 130 also generates an unknown signal state space representation signal 139 based on separated signals 129. Unknown signal state space representation signal 139 contains data representative of additional (e.g., non-PDW type) characteristics of interest of one of radar signals 114 and 116 from which usable spatial information about one of radar signal emitters 106 and 107 is discernable. PDW parameter vector signals 138 and unknown signal state space representation signals 139 are transmitted to post-processor 105.

As seen in FIG. 6, post-processor 105 includes a computing device 132 and a memory 134. The memory 134 comprises one or more non-transitory tangible computer-readable storage media. Post-processor 105 is communicatively coupled to pre-processor 104. In accordance with one embodiment, the computing device 132 is a processor running software. The PDW generation module 128 is configured to receive a respective separated signal 129 from each SST channel 62. PDW generation module 128 is further configured to transmit a PDW parameter vector signal 138 to post-processor 105. PDW parameter vector signal 138 received by computing device 132 is stored as computer-readable data in memory 134 including, without limitation, as at least one buffered data set.

The PDW generation module 128 sends each PDW to the computing device 132 as a PDW parameter vector signal 138 similar to (amplitude, time of arrival, center frequency, pulse width and bandwidth)=(amp, toa, f, pw, w). The PDW for each intercepted signal is stored in a pulse buffer for further processing by the computing device 132. As part of such processing, the PDWs are sorted and deinterleaved by clustering the incoming radar pulses into groups. In principle, each group should have characteristics representative of a single radar source or class of radar sources which allows that radar source or class to be identified. The identity of a particular signal is usually inferred by correlating the observed characteristics of that signal with characteristics stored in a list that also contains the identity of known radars.

In addition, the pulse denoising module 130 is configured to receive decimated/down-converted signals 129 from each SST channel 62. Pulse denoising module 130 is further configured to transmit an unknown signal state space representation signal 139 to post-processor 105. Unknown signal state space representation signal 139 received by computing device 132 is stored as computer-readable data in memory 134, including, without limitation, as at least one buffered data set. In an exemplary implementation, computing device 132 fetches buffered data sets from memory 134 for processing using a computer-based method that employs an operating system running software executed from instruction set data also stored in memory 134.

The computing device 132 is configured to perform operations based on data contained in the PDW parameter vector signals 138 and unknown signal state space representation signals 139. Such operations include, without limitation, detecting, processing, quantifying, storing, and controlling a display device 144 for displaying (e.g., in human-readable data form) various characteristics of at least one of the radar signals 114 and 116 represented as data in the PDW parameter vector signals 138 and unknown signal state space representation signals 139. For example, a PDW parameter vector signal 138 generated by PDW generation module 128 may contain a plurality of PDW vector data blocks structured in a vector format, where each PDW vector data block contains one parameter of the first radar signal 114. Parameters representative of at least one characteristic of the first radar signal 114 contained in one PDW vector data block may include, without limitation, frequency, bandwidth, time of arrival, time of departure, pulse width, pulse amplitude, pulse repetition interval, and/or AOA.

Resultant data from operations performed by the computing device 132 are stored in memory 134. Further, in the exemplary implementation, computing device 132 causes post-processor 105 to transmit a human-readable data signal 142 to a human machine interface to facilitate at least one of an interaction, a modification, a visualization, at least one further operation, and a viewable recording of information about at least one radar signal 114 and 116 by a user of signal processing system 100. The human machine interface may be, for example, a display device 144 which receives the human-readable data signal 142 from post-processor 105. In one example, characteristics of radar signal emitters 106 and 107 determined by signal processing system 100 are displayed on display device 144 as a map having a grid representative of a physical spatial domain including a surveillable space of sensor 103, where locations and identifying information of radar signal emitters 106 and 107 are displayed and plotted substantially in real time. The human-readable data signal 142 may also be transmitted from post-processor 105 to at least one device and/or system (e.g., an aerial or ground-based vehicle) associated with signal processing system 100.

In one mode of operation, at least one of frequency and bandwidth information contained in respective PDWs is plotted on a map on the display device 144 along with locations of respective radar signal emitters 106 and 107 to facilitate accurate tracking of locations and association with those particular radar signal emitters. In cases where at least one radar signal emitter is mobile, the map on display device 144 updates location information of at least one respective mobile radar signal emitter in substantially real time. Furthermore, the computing device 132 determines at least one of a velocity, an acceleration, a trajectory, and a track (i.e., including present and prior locations) of one or more mobile radar signal emitters (e.g., radar signal emitters 106 and 107).

In another mode of operation, characteristics determined by signal data processing methods implemented by the signal data processor 101 may trigger a variety of substantially real-time physical actions in physical devices and systems in communication with the signal processing system 100. For example, the computing device 132 enables post-processor 105 to transmit, in substantially real time, an actuator control signal 148 to an actuator controller 150 included within an aerial or ground-based vehicle 146 to facilitate controlled movements thereof. For example, vehicle 146 may be a remotely and/or autonomously operated land vehicle or an unmanned aerial vehicle. More specifically, characteristics of various radar signal emitters, including frequency and bandwidth determined by signal data processing methods implemented by signal processing system 100, may be transmitted in substantially real time as data to actuator controller 150 in vehicle 146 (e.g., rudders and flaps of a unmanned aerial vehicle) to facilitate maneuvers thereof, for example, to avoid an area of operation of an unauthorized radar signal emitter determined to be a threat or to move toward the unauthorized emitter to eliminate the threat.

As a further example, characteristics of radar signal emitters 106 and 107 determined by signal data processing methods described herein may be transmitted in substantially real time in a control signal to at least one of an electronic support measure (ESM) device and an EW system associated with signal processing system 100 to direct, for example, a radar jamming signal at a particular radar signal emitter operating in the surveillable environment of sensor 103 without authorization.

The innovative technology proposed herein provides an efficient means of down-conversion and decimation of a blind source separated signal. The proposed technology adopts a mixer-free approach to signal detection, characterization, and demodulation. The algorithm 22 can efficiently produce a decimation rate that is most efficient for a mixer-free down-conversion and decimation. In addition, the proposed technology may be implemented efficiently on a digital signal processor or field-programmable gate array. These features provide benefits, including reduced phase noise, increased signal-to-noise ratio and detection rates, and better demodulation performance, especially for larger constellations as used in modern 5G signals.

While systems and methods for direct signal down-conversion and decimation in a digital receiver have been described with reference to various embodiments, it will be understood by those skilled in the art that various changes may be made and equivalents may be substituted for elements thereof without departing from the teachings herein. In addition, many modifications may be made to adapt the concepts and reductions to practice disclosed herein to a particular situation. Accordingly, it is intended that the subject matter covered by the claims not be limited to the disclosed embodiments.

The invention claimed is:

1. A method for decimating and down-converting passband signals comprising:
    (a) transducing electromagnetic radiation carrying a repetitive signal into an analog electrical passband signal;
    (b) converting the analog electrical passband signal into passband signal samples at a sampling rate;
    (c) estimating a center frequency and a bandwidth of the passband signal;
    (d) calculating a decimation ratio and a channel index based on estimated center frequency and estimated bandwidth; and
    (e) decimating and down-converting the passband signal samples to a sample rate which is less than the sampling rate based on the decimation ratio and channel index.

2. The method as recited in claim 1, wherein step (d) is an algorithm comprising:
    defining boundaries of a frequency interval $[f_{lo}, f_{hi}]$ based on estimated center frequency and estimated bandwidth;
    setting a value of a parameter m equal to floor(1/b), where b is the estimated bandwidth;
    computing $m_{hi} = \lfloor mf_{hi} \rfloor$ using a floor function;
    computing $v_{hi} = \lfloor m_{hi}/f_{hi} \rfloor$ using the floor function;
    computing $m_{lo} = \lfloor mf_{lo} \rfloor$ using the floor function;
    computing $v_{lo} = \lfloor m_{lo}/f_{lo} \rfloor$ using a ceiling function;
    computing a decimation ratio $L = \max(v_{lo}, v_{hi})$; and
    computing a channel index $\underline{k} = \lfloor Lf_{lo} \rfloor$.

3. The method as recited in claim 2, wherein the algorithm further comprises determining whether conditions $k/L > f_{lo}$ or $(k+1)/L < f_{hi}$ and $m_{lo}$ and $m_{hi} > 0$ are met or not.

4. The method as recited in claim 3, wherein the algorithm further comprises refining the decimation ratio L and the channel index k in response to a determination that $k/L > f_{lo}$ or $(k+1)/L < f_{hi}$ and $m_{lo}$ and $m_{hi} > 0$.

5. The method as recited in claim 3, wherein the algorithm further comprises outputting the decimation ratio L and the channel index k in response to a determination that the conditions are not met.

6. The method as recited in claim 1, wherein step (e) comprises:
    inputting the passband signal samples into a plurality of decimators at successive times, the number of decimators in the plurality of decimators being equal to the decimation ratio; and
    decimating the passband signal samples to the sample rate by means of the plurality of decimators.

7. The method as recited in claim 6, wherein step (e) further comprises filtering the decimated passband signal samples by means of a plurality of sub-filters respectively connected to the plurality of decimators.

8. The method as recited in claim 7, wherein step (e) further comprises multiplying some of the filtered passband signal samples by respective weights which change over time as a function of the index channel.

9. The method as recited in claim 8, wherein step (e) further comprises summing results of the decimating, filtering, and multiplying operations and then outputting the passband signal samples having the sample rate.

10. The method as recited in claim 9, further comprising: processing the passband signal samples having the sample rate to generate pulse descriptor words comprising respective data sets of parameter values of the repetitive signal, wherein each data set of parameter values making up a pulse descriptor word comprises amplitude, time of arrival, and frequency.

11. The method as recited in claim 10, further comprising identifying a source of the repetitive signal based on the data sets of parameter values.

12. The method as recited in claim 10, further comprising directing movement of a vehicle based on the data sets of parameter values.

13. Passband-to-passband decimation/down-conversion circuitry comprising:
    circuitry for performing an algorithm that converts an estimated signal center frequency $f_C$ and an estimated signal bandwidth b to a decimation ratio L and a channel index k; and
    a polyphase decimator/down-converter which is connected to receive the decimation ratio L and channel index k and configured to decimate the passband samples having a sample rate $f_S$ by a factor of L and then down-convert an original passband frequency to a lower passband frequency.

14. The circuitry as recited in claim 13, wherein the polyphase decimator/down-converter comprises:
    a plurality of decimators connected to receive passband signal samples: and
    a plurality of down-converters connected to receive decimated passband signal samples from the plurality of decimators respectively.

15. The circuitry as recited in claim 14, wherein each down-converter of the plurality of down-converters comprises a respective bandpass filter followed by a respective multiplier.

16. The circuitry as recited in claim 14, wherein the algorithm comprises:
    defining boundaries of a frequency interval $[f_{lo}, f_{hi}]$ based on the estimated center frequency and estimated bandwidth;
    setting a value of a parameter m equal to floor(1/b), where b is the estimated bandwidth;
    computing $m_{hi} = \lfloor mf_{hi} \rfloor$ using a floor function;
    computing $v_{hi} = \lfloor m_{hi}/f_{hi} \rfloor$ using the floor function;
    computing $m_{lo} = \lfloor mf_{lo} \rfloor$ using the floor function;
    computing $v_{lo} = \lfloor m_{lo}/f_{lo} \rfloor$ using a ceiling function;
    computing the decimation ratio $L = \max(v_{lo}, v_{hi})$; and
    computing the channel index $\underline{k} = \lfloor Lf_{lo} \rfloor$.

17. The circuitry as recited in claim 16, wherein the algorithm further comprises determining whether conditions $k/L > f_{lo}$ or $(k+1)/L < f_{hi}$ and $m_{lo}$ and $m_{hi} > 0$ are met or not.

18. The circuitry as recited in claim 17, wherein the algorithm further comprises refining the decimation ratio L and the channel index k in response to a determination that $k/L > f_{lo}$ or $(k+1)/L < f_{hi}$ and $m_{lo}$ and $m_{hi} > 0$.

19. The circuitry as recited in claim 17, wherein the algorithm further comprises outputting the decimation ratio L and the channel index k in response to a determination that the conditions are not met.

20. A signal processing system comprising:
- a sensor configured to transduce electromagnetic radiation carrying a repetitive signal into an analog electrical signal;
- an analog-to-digital converter configured to convert the analog electrical signal into signal samples;
- a cueing system connected to receive the signal samples and configured to process the signal samples to generate digital data representing an estimated signal center frequency $f_C$ and an estimated bandwidth b; and
- a plurality of signal separation and tracking channel comprising:
- circuitry for performing an algorithm that converts estimated signal center frequency $f_C$ and estimated signal bandwidth b to a decimation ratio L and a channel index k; and
- a polyphase decimator/down-converter which is connected to receive decimation ratio L and channel index k and configured to decimate the passband samples having a sample rate $f_S$ by a factor of L and then down-convert an original passband frequency to a lower passband frequency.

* * * * *